United States Patent
Geller et al.

[11] Patent Number: 5,929,510
[45] Date of Patent: Jul. 27, 1999

[54] INTEGRATED ELECTRONIC CIRCUIT

[75] Inventors: Bernard Dov Geller, Princeton, N.J.; Aly E. Fathy, Langhorne, Pa.; Stewart M. Perlow, Marlboro, N.J.; Ashok Naryan Prabhu, East Windsor, N.J.; Ellen Schwartz Tormey, Princeton Jct., N.J.; Valerie Ann Pendrick, Cranford, N.J.; Israel Haim Kalish, West Orange, N.J.

[73] Assignees: Sarnoff Corporation, Princeton, N.J.; Sharp Kabushiki Kaisha, Osaka, Japan

[21] Appl. No.: 08/960,663

[22] Filed: Oct. 30, 1997

Related U.S. Application Data

[63] Continuation-in-part of application No. 08/741,809, Oct. 31, 1996, abandoned
[60] Provisional application No. 60/029,417, Oct. 31, 1996.
[51] Int. Cl.⁶ .............................. H01L 29/40; H01P 1/15; H05K 1/00
[52] U.S. Cl. .......................... 257/635; 257/691; 257/668; 257/664; 257/685; 257/728; 257/706; 333/204
[58] Field of Search ..................... 257/635, 691, 257/668, 664, 685, 728, 706; 333/204

[56] References Cited

U.S. PATENT DOCUMENTS

| | | | |
|---|---|---|---|
| 5,206,712 | 4/1993 | Kornprumpg et al. | 333/204 |
| 5,387,888 | 2/1995 | Eda et al. | 257/728 |
| 5,559,363 | 9/1996 | Immorlica, Jr. | 257/664 |
| 5,654,681 | 8/1997 | Ishizaki et al. | 333/204 |
| 5,783,976 | 7/1998 | Furutani et al. | 333/204 |

FOREIGN PATENT DOCUMENTS

4319878-A1   12/1993   Germany .

*Primary Examiner*—Peter Toby Brown
*Assistant Examiner*—Hung Van Duong
*Attorney, Agent, or Firm*—William J. Burke

[57] ABSTRACT

An electronic integrated circuit which includes at least one of RF, microwave, digital and analog components connected in a desired circuit. The integrated circuit includes a substrate of a conductive material having on a surface thereof a body of a dielectric material. The dielectric body is formed of a plurality of layers of the dielectric material bonded together. A plurality of strips of a conductive material are on the surfaces of the layers of the body to form RF, analog and digital components. Discrete electronic devices are mounted on the body and connected in the circuit. Vias of a conductive material extend through the various layers of the body to electrically connect the various strips of conductive material on the layers of the body.

9 Claims, 2 Drawing Sheets

INTEGRATED ELECTRONIC CIRCUIT

CROSS-REFERENCES TO RELATED APPLICATIONS

This application is a continuation-in-part of U.S. application Ser. No. 08/741,809, filed on Oct 31, 1996, now abandoned, and claims under 35 U.S.C. §119(e)(1) the benefit of the filing date of U.S. provisional application Ser. No. 60/029,417, filed Oct. 31, 1996.

FIELD OF THE INVENTION

The invention relates to an integrated electronic circuit, and, more particularly to an integrated electronic circuit which can include RF, microwave, analog and digital systems and is of minimal size.

BACKGROUND

The emergence of new consumer markets in the personal communications field has driven manufacturers to develop smaller, lighter, more reliable, and cheaper products. These products generally combine RF, microwave, analog, and digital components to form a single unit such as a personal communications handset, for example a cellular phone handset. In a cellular phone handset there are RF circuits which include various passive and active components, such as (on the receive side) diplexer filter, low noise amplifiers, image reject filters, mixers, oscillators, IF amplifiers and various other components. On the RF transmit side, it includes power amplifiers and combiner circuits, in addition to the low frequency digital circuits. The required RF filters, especially the diplexer and image filters, are relatively expensive surface-mount components and consume valuable board surface area. Moreover, to form microwave integrated circuits has been a problem since such devices often require ground planes within which the device is formed.

Current practice is based on combining various RF, microwave, analog, and digital functional blocks (as discrete components) on a low cost flexible printed circuit board, generally of a plastic material. This board may have more than one layer but the buried layers are generally used only as DC or digital interconnects. No RF or microwave components are buried.

The need to reduce the size and weight of these units has led developers to look at low cost multi-layer integration schemes. Reliability, low cost, small size, light weight and performance are main issues in the development of such a technology.

SUMMARY OF THE INVENTION

An electronic integrated circuit includes a substrate of a conductive material having a surface and a body of a glass or ceramic dielectric material is on and bonded to the surface of the substrate. The dielectric body is formed of a plurality of layers of the dielectric material bonded together. A plurality of strips of a conductive material are on the surfaces of at least some of the layers of the dielectric body and form one or more of RF, microwave, analog and digital components and interconnects which are connected together to form a desired circuit.

DETAILED DESCRIPTION

Figure 1:
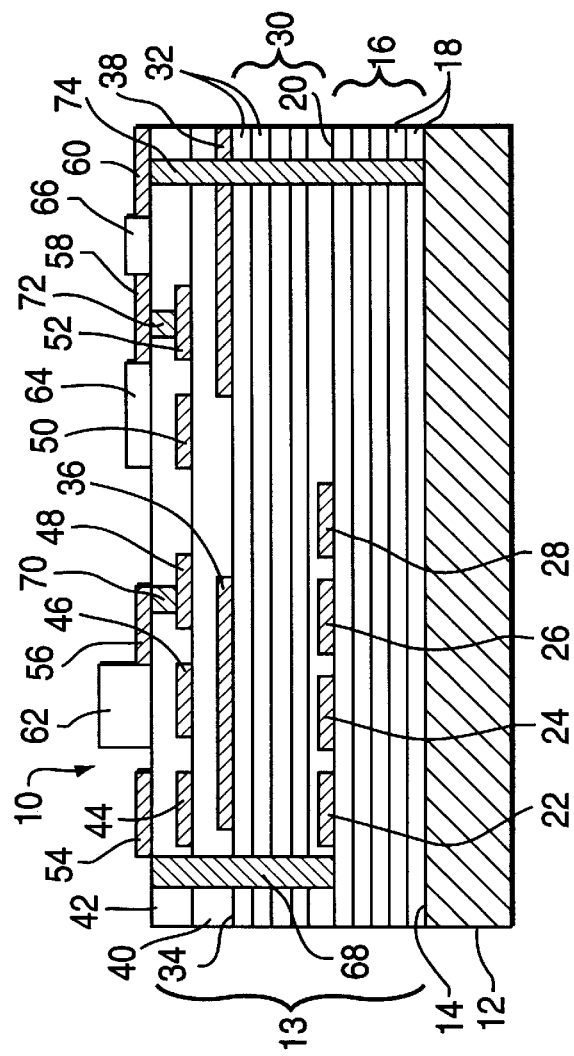
FIG. 1 is a sectional view of a portion of one form of an integrated electronic circuit in accordance with the present invention.

Referring initially to FIG. 1, one form of an integrated electronic circuit in accordance with the invention is generally designated as 10. Integrated circuit 10 comprises a substrate 12 of a plate of a conductive metal. On and bonded to a surface 14 of the substrate 12 is a body 13 of a dielectric material, such as a glass or ceramic. The body 13 is formed of a first relatively thick layer 16 of an inorganic dielectric material, such as a ceramic or glass. As will be explained, the dielectric layer 16 is made up of a plurality of thin layers 18 of the dielectric material which are bonded together. On a surface 20 of the dielectric layer 16 are a plurality of strips 22, 24, 26 and 28 of a conductive material, such as a metal. Each of the strips 22, 24, 26 and 28 is a thin layer of the metal coated on the surface 20 of the dielectric layer 16. As will be explained, the metal strips 22, 24, 26 and 28 form at least a portion of an electronic component. Although four of the metal strips 22, 24, 26 and 28 are shown, there can be any desired number of the metal strips depending on the electronic components being formed.

On and bonded to the first dielectric layer 16 is a second relatively thick layer 30 of an inorganic dielectric material, such as a ceramic or glass. The second dielectric layer 30 is also formed of a plurality of thin layers 32 of the dielectric material which are bonded together. On a surface 34 of the second dielectric material 30 are a plurality of strips 36 and 38 of a conductive metal. The metal strips 36 and 38 are layers of the metal coated on the surface 34. As will be explained, the metal strips 36 and 38 form at least a portion of electronic components. Although only two metal strips 36 and 38 are shown, there can be any number of the metal strips depending on the desired electronic components being formed.

A thin layer 40 of a dielectric material, such as a glass or ceramic, is on and bonded to the second dielectric layer 30, and another thin layer 42 of a dielectric material is on and bonded to the thin dielectric layer 40. A plurality of strips 44, 46, 48, 50 and 52 of a conductive metal are on the surface of the thin dielectric layer 40, and a plurality of metal strips 54, 56, 58 and 60 are on the surface of the thin dielectric layer 42. Also on the surface of the thin dielectric layer 42 are various discrete components 62, 64 and 66, such as resistors, capacitors, transistors, etc. A plurality of conductive vias 68, 70, 72 and 74 extend through the dielectric layers to electrically interconnect the conductive strips on the various dielectric layers. For example, via 68 extends through the thin dielectric layers 42 and 40 and the second thick dielectric layer 30 to electrically connect the metal strip 54 on the thin dielectric layer 42 to the conductive strip 22 on the first dielectric layer 16. Vias 70 and 72 extend through the thin dielectric layer 42 to connect metal strips on the thin dielectric layer 42 to metal strips on the thin dielectric layer 40. Via 74 extends through all of the dielectric layers 42, 40, 30 and 16 to provide a connection to the substrate 12.

In the integrated circuit 10, the various metal strips form at least portions of various electronic components. For example, the strips 54, 56, 58 and 60 on the surface of the dielectric layer 42 can form RF interconnects, I/O ports and inductors. The metal strips 44, 46, 48, 50 and 52 on the surface of the dielectric layer 40 can form series capacitors, series or shunt resistors, cross-unders and interconnects. The metal strips 36 and 38 on the second dielectric layer 30 can form a microstrip ground plane, a stripline ground plane, or shunt capacitors. The metal strips 22, 24, 26 and 28 on the surface of the first dielectric layer 16 can form an RF filter center conductor, and the metal substrate 12 can form a second stripline ground plane. The various electronic components formed by the metal strips can be electrically connected together by the conductive vias which extend through the dielectric layers to contact the metal strips. Also, some of the metal strips can be patterned to form interconnects which connect the various electronic components. The discrete components 62, 64 and 66 mounted on the dielectric layer 42 are also connected in the desired circuit by some of the metal strips.

As previously stated, the integrated circuit 10 may be provided with RF components, microwave components, analog components and digital components. For proper operation, the RF stripline filter must be formed in conjunction with the first and second dielectric layers 16 and 30. This is so since the center conductor of the filter must be between two ground planes which are provided by the substrate 12 and a metal strip on the second dielectric layer 30. Also, inductors must be formed on the surface of the thin dielectric layer 42 to keep it away from the ground planes and to decrease parasitic capacitance. Similarly, the position of other electronic components may be determined by their interrelation with other components so that one component does not interfere with any neighboring component.

The integrated circuit 10 is made using a plurality of thin tapes of green or unhardened ceramic or glass. The green tapes are formed by mixing particles of a glass in a liquid vehicle and a polymer binder. The mixture is spread on a surface of a metal base to form a layer of the mixture which is allowed to dry. This forms the green tape of the glass particles in the binder. To form the thick first and second dielectric layers 16 and 30, a plurality of the green tapes are placed in stacked relation to the desired thickness. The thin layers 40 and 42 are each a single strip of the green tape. The green tapes are then coated with metal layers to form the various metal strips. The green tapes with the metal strips thereon are then stacked in proper order on the surface 14 of the metal substrate 12 and fired at a temperature at which the binder is driven off and the glass particles melt. When cooled, the melted glass fuses together to form the various layers and to bond the layers together and to the substrate 12 to form the body 13 secured to the substrate 12. By firing the green tapes at the proper temperature, the glass particles may be devitrified to form layers of a ceramic material. Prior to firing the green tapes, holes may be formed therein where the vias are to be provided. The holes may be filled with a conductive material either before firing the green tapes or after the tapes are fired and formed into the body 13.

Figure 2:
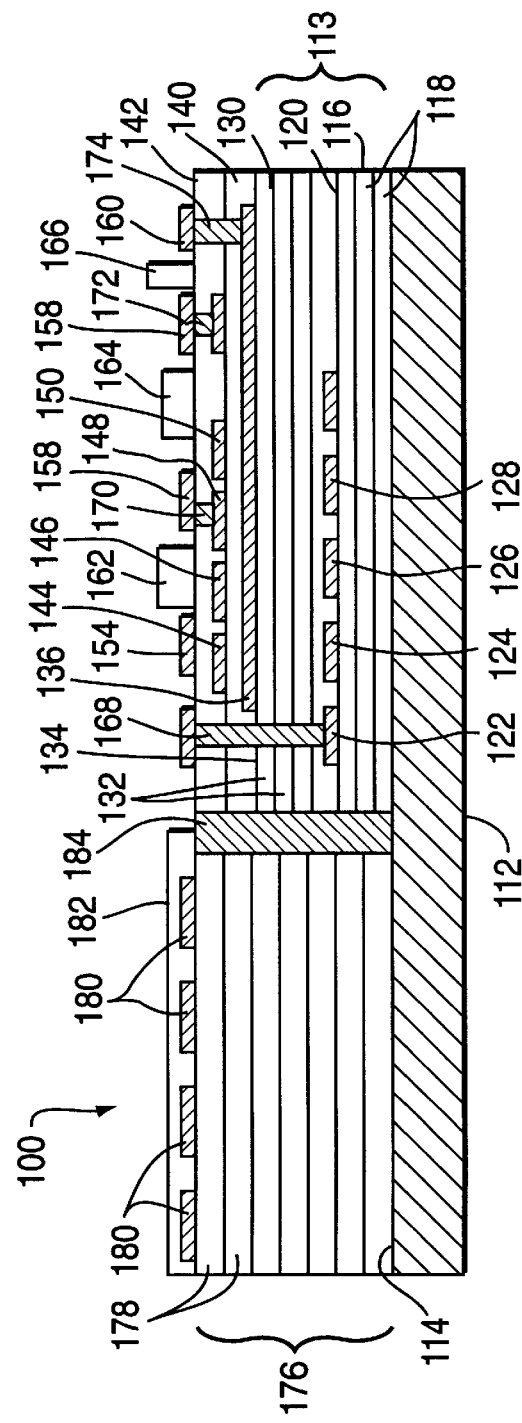
FIG. 2 a sectional view of a portion of another form of an integrated electronic circuit in accordance with the present invention.

Referring to FIG. 2, another form of the integrated electronic circuit which incorporates the invention is generally designated as 100. Integrated circuit 100 comprises a substrate 112 of a conductive metal having a surface 114. On and bonded to a portion of the surface 114 of the substrate 112 is a first body 113 of a dielectric material, such as glass or ceramic. The first body 113 if formed of a first thick layer 116 of a dielectric material made up of a plurality of thin layers 118. On the surface 120 of the first dielectric layer 116 are a plurality of metal strips 122, 124, 126 and 128. A second thick layer 130 of a dielectric material is on and bonded to the surface 120 of the first dielectric layer 130. The second dielectric layer 130 is also formed of a plurality of thin layer 132 of the dielectric material. On the surface 134 of the second dielectric layer 132 is at least one strip 136 of a conductive metal. A pair of thin layers 140 and 142 of a dielectric material are stacked on and bonded to the surface 134 of the second dielectric layer 130. A plurality of strips 144, 146, 148, and 150 of a conductive metal are on the dielectric layer 140 and a plurality of strips 154, 156, 158 and 160 are on the dielectric layer 142. A plurality of discrete components 162, 164 and 166, such as resistors, capacitors, transistors, etc. are on the dielectric layer 142 and are electrically connected to some of the metal strips. Vias 168, 170, 172 and 174 of a conductive metal extend through the various dielectric layers to electrically connect the metal strips to form a desired circuit.

A second body 176 of a dielectric material is on and bonded to the portion of the surface 114 of the substrate 112 adjacent the first body 113. The second body 176 is formed of a plurality of layers 178 of the dielectric material which are stacked to a thickness substantially equal to the total thickness of the first body 113. On the surface of the second body 176 are strips 180 of a conductive metal. A thin layer 182 of a dielectric material is on the surface of the second body 176 and covers the metal strips 180. A via 184 of a conductive metal extends between the second body 176 and the first body 113.

In the integrated electronic circuit 100, like in the integrated electronic circuit 10 shown in FIG. 1, the various metal strips form at least portions of various electronic components and interconnects. The electronic components are electrically connected together and to the discrete components on the dielectric layer 142 by the vias and the interconnects to form a desired electronic circuit. The electronic circuit can include RF, microwave, analog and digital components. In the integrated electronic circuit 100, an RF component, such as a diplexer filter, can be formed in the second body 176. This has the advantage that the diplexer filter, which is generally required to be of minimum RF loss, is realized in a microstrip rather than stripline form. This allows the filter to perform better and results in a thinner and lighter circuit. The integrated electronic circuit 100 is made in the same manner as described above with regard to the integrated electronic circuit 10.

Figure 3:
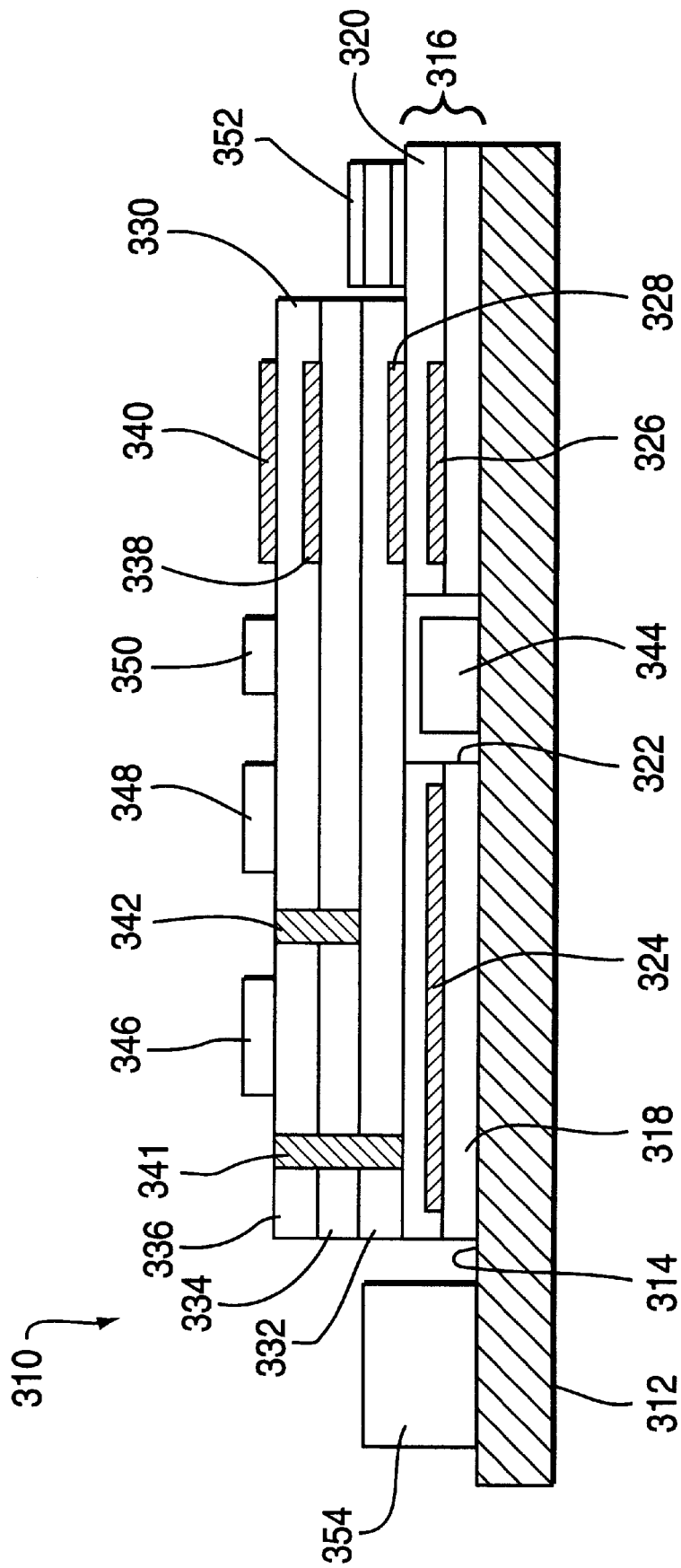
FIG. 3 is a sectional view of a form of a microwave integrated circuit in accordance with the present invention.

Referring to FIG. 3, a microwave integrated circuit in accordance with an embodiment of the invention is generally designated as 310. Microwave integrated circuit 310 comprises a substrate 312 of a plate of a conductive metal. Mounted on and secured to a surface 314 of the substrate 312 is a body 316 of a dielectric material, such as a ceramic or glass. The body 316 is formed of two layers 318 and 320 bonded together. The body 316 has an opening 322 therethrough to the substrate 312. Between the layers 318 and 320 at one side of the opening 322 is a layer 324 of a conductive metal which is coated on the surface of the layer 318. Also between the layers 318 and 320 at the other side of the opening 322 is a narrow layer 326 of a conductive metal which is also coated on the surface of the layer 318. On the layer 320 and directly over the metal layer 326 is a narrow layer 328 of a conductive metal.

A cover 330 extends over and is mounted on the body 316 and extends over the opening 322. The cover 330 is formed of a plurality of layers 332, 334 and 336 of a dielectric material, such as a glass or ceramic, which are bonded together. A strip 338 of a conductive material, such as a metal, is between the middle layer 334 and the top layer 336 along one edge of the cover 330. A strip 340 of a conductive material is on the top layer 336 and extends over the metal strip 338. The layers 332, 334 and 336 may have thereon patterns of a conductive material forming interconnects (not shown). A via 341 of a conductive material extends through the layers 336, 334 and 332 to electrically connect an interconnect pattern on the top layer 336 to the interconnect pattern on the bottom layer 332. A via 342 of a conductive material extends through the top and middle layers 336 and 334 to electrically connect an interconnect pattern on the top layer 336 to an interconnect pattern on the middle layer 334. Other vias may be provided to connect the various interconnect patterns on the layers 332, 334 and 336.

A discrete semiconductor component 344, such as a discrete microwave component, is mounted in the opening 322 in the body 316 on the substrate 312. The discrete component 344 is electrically connected to the various conductive patterns on the layers of the body 316 to electrically connect the component 344 to other electrically devices on the body 312. Other discrete components 346, 348 and 350 are mounted on the top layer 336 of the cover 330 and are electrically connected together and to other components in the integrated circuit 310 by the interconnects and the vias to form an integrated circuit. As shown, an antenna 352 is mounted on the top of the body 316 at one end of the cover 330, and a battery 354 is mounted on the substrate 312 adjacent another end of the body 312.

In the microwave integrated circuit 310, the conducting strips 326, 328, 338 and 340 form various types of microwave components, such as delay lines, filters, capacitors, etc. These devices are electrically connected to each other and to the discrete components 344, 346, 348 and 350 through the interconnect patterns and the vias 341 and 342 to form a desired microwave integrated circuit. The conductive substrate 312 serves as a ground plane for the integrated circuit. The antenna 352 and the battery 354 are also electrically connected to the integrated circuit through the interconnect patterns. Although only a few types of electrical components are shown, any well known type of electrical component can be formed on the layers of the body 316 or the cover 330 or provided by the discrete components mounted in or on the body 316 and the cover 330. Also, other ground planes may be provided by conductive layers on the various layers of the body 316 or cover 330.

The body 316 and the cover 330 may each be formed by first mixing particles of the dielectric material, such as a glass or ceramic, in a vehicle, such as a plastic. The mixture is spread out on a surface to form a layer of a desired size, shape and thickness. The layers are dried to form a green tape of the dielectric material. The various conductive strips and patterns are then coated on the surfaces of the layers of green tape. The layers which are to form the body 316 are cut to form the opening 322. The layers of green tape having the conductive strips and patterns thereon are stacked to form the body 316 and the cover 330. The layers forming the body 316 are stacked on a metal substrate. The stack of green tapes are then fired to melt the particles of the dielectric material and bond the particles together. When cooled, this forms the solid body 316 and cover 330. The cover 330 may be placed over the body 316 and secured thereto with a suitable bonding material.

Thus, there is provided by the invention an integrated electronic circuit which can include RF, microwave, analog and digital components so as to permit the forming of various circuits, particularly those used in the communications field. The integrated electronic circuit of the invention is ideal for use in a variety of electronic systems. The integrated electronic circuit of the invention is well suited for use in communications handsets and base stations, and more particularly wireless communications handsets and base stations, where small size is desired or required. The invention may be used in general with RF receivers and transmitters, including RADAR systems. By allowing the combination of RF and digital components in the package, the invention proves useful in PCMCIA modules and the like. The invention allows for miniaturization of many systems, including digital systems, and thus will find use in the field of computers and digital processing devices. In microwave applications, the invention allows the various microwave components to be located close to the ground plane formed by the substrate or by conductive layers on the body or cover.

The components are formed in and on a body of a glass or ceramic with at least some of the components being buried in the body. This provides a more compact and sturdy device which can be made easily and inexpensively. Although the forms of the integrated electronic circuit shown and described have about four layers of the dielectric material, the integrated electronic circuit can be made of any number of the layers which are required to form the desired circuit. Also, the thickness of the layers can be varied as required and the number and size of conductive strips on the layers can be varied according to the particular circuit being formed.

What is claimed is:

1. An electronic integrated circuit comprising:
   a supporting substrate of a conductive material having first and second opposed surfaces;
   a body of a dielectric material on and bonded to only the first surface of the substrate, said body including a first thick layer of the dielectric material on the first surface of the substrate, at least one strip of a conductive material only on the surface of the first thick layer, a second thick layer of the dielectric material on the first thick layer, a strip of a conductive material only on the second thick dielectric layer, and additional layers of the dielectric material on the second thick dielectric layer said layers being in stacked relation and bonded together; and
   a plurality of strips of a conductive material on the surfaces of at least some of the additional layers of the body, the conductive strip on the first thick dielectric layer forming a filter wherein the conductive strip on the second thick dielectric layer and the substrate are the ground planes of the filter, and other of said conductive strips forming at least one of an RF components, microwave component, analog component, digital component and interconnect which are connected together to form a desired circuit.

2. The circuit of claim 1 further comprising at least one discrete component electrically connected in the circuit.

3. The circuit of claim 2 in which the body has an opening therethrough to the first surface of the substrate and the discrete component is mounted on the first surface of the substrate within the opening in the body.

4. The circuit of claim 3 including a cover of a dielectric material mounted on and secured to said body and extending over the opening in the body, said cover being formed of a plurality of layers of the dielectric material bonded together wherein layers of a conductive material are on the surfaces of the layers of the cover forming microwave devices and interconnect patterns.

5. The circuit of claim 1, further comprising vias of a conductive material extending through the various layers of the body to electrically connect the conductive strips on the various layers.

6. The circuit of claim 1 in which each of the first and second thick dielectric layers is formed of a plurality of thin layers of the dielectric material bonded together.

7. An electronic integrated circuit comprising:

a supporting substrate of a conductive material having first and second opposed surfaces;

a body of a dielectric material on and bonded to only a portion of the first surface of the substrate, said body including a plurality of layers of the dielectric material in stacked relation and bonded together;

a second body of the dielectric material on and bonded to another portion of the first surface of the substrate spaced from the first body; and strips of a conductive material on the second body forming a filter, and a plurality of strips of a conductive material on the surfaces of at least some of the layers of the first body, said conductive strips forming at least one of an RF component, microwave component, analog component, digital component and interconnect which are connected to form a desired circuit.

8. The circuit of claim 7 further comprising a via of a conductive material extending between the first said dielectric body and the second dielectric body to serve as a shield.

9. The circuit of claim 8 further comprising a layer of a dielectric material on the second dielectric body and over the conductive strips on the second dielectric body.

* * * * *